United States Patent
Yu

(10) Patent No.: US 6,787,272 B2
(45) Date of Patent: Sep. 7, 2004

(54) ASSIST FEATURE FOR RANDOM, ISOLATED, SEMI-DENSE, AND OTHER NON-DENSE CONTACTS

(75) Inventor: Shinn-Sheng Yu, Taichung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 207 days.

(21) Appl. No.: 10/086,605

(22) Filed: Mar. 1, 2002

(65) Prior Publication Data

US 2003/0165654 A1 Sep. 4, 2003

(51) Int. Cl.$^7$ .................................................. G03F 9/00

(52) U.S. Cl. .............................. 430/5; 430/22; 430/30; 716/19; 716/20

(58) Field of Search ................................ 430/5, 22, 30; 716/20, 21

(56) References Cited

U.S. PATENT DOCUMENTS

| | | | | |
|---|---|---|---|---|
| 5,422,205 A | * | 6/1995 | Inoue et al. | 430/5 |
| 5,700,601 A | * | 12/1997 | Hasegawa et al. | 430/5 |
| 6,355,382 B1 | * | 3/2002 | Yasuzato et al. | 430/5 |

* cited by examiner

Primary Examiner—Mark F. Huff
Assistant Examiner—K. Sagar
(74) Attorney, Agent, or Firm—Tung & Associates

(57) ABSTRACT

An assist feature for isolated, and semi-dense random contacts, as may be present on a photomask used in photolithographic processes for semiconductor device fabrication, is disclosed. The assist feature can be used in conjunction with off-axis illumination (OAI) for such non-dense contacts, for improving the depth of focus (DOF), resolution, or both of photolithography for such contacts, such that the non-dense contact preferably substantially mimics a dense contact during OAI. A photomask of the invention includes a number of assist features situated near and around the non-dense contact. A method for creating a photomask according to the invention, as well as a method for fabricating a semiconductor device using such a mask, are also disclosed.

15 Claims, 8 Drawing Sheets

ASSIST FEATURE FOR RANDOM, ISOLATED, SEMI-DENSE, AND OTHER NON-DENSE CONTACTS

FIELD OF THE INVENTION

This invention relates generally to semiconductor device fabrication, and more particularly to the use of assist features in conjunction with off-axis illumination (OAI) for such fabrication.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, and less are becoming routine. Improvement in overlay tolerances in photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on lithographic processes. Resolution of anything smaller than a wavelength is generally quite difficult. Pattern fidelity can deteriorate dramatically in sub-wavelength lithography. The resulting semiconductor features may deviate significantly in size and shape from the ideal pattern drawn by the circuit designer. These distortions include line-width variations dependent on pattern density, which affect a device's speed of operation, and line-end shortening, which can break connections to contacts. To avoid these and other optical proximity effects, the semiconductor industry has attempted to compensate for them in the photomasks themselves, as well as by using other approaches.

This compensation in the masks themselves is generally referred to as optic al proximity correction (OPC). The goal of OPC is to produce smaller features in an IC using a given equipment set by enhancing the printability of a wafer pattern. OPC applies systematic changes to mask geometries to compensate for the nonlinear distortions caused by optical diffraction and resist process effects. A mask incorporating OPC is thus a system that negates undesirable distortion effects during pattern transfer. OPC works by making small changes to the IC layout that anticipate the distortions. OPC offers basic corrections and a useful amount of device yield improvement, and enables significant savings by extending the lifetime of existing lithography equipment. Distortions that can be corrected by OPC include line-end shortening, corner rounding, and isolated-dense proximity effect.

Isolated-dense proximity effect, or bias, in particular refers to the degree to which the mean of measured dense features differs from the mean of like-sized measured isolated features. Isolated-dense bias is especially important in the context of critical dimensions (CD's), which are the geometries and spacings used to monitor the pattern size and ensure that it is within the customer's specification. CD bias, therefore, refers to when the designed and actual values do not match. Ideally, bias approaches zero, but in actuality can measurably affect the resulting semiconductor device's performance and operation. Isolated features, such as lines, can also negatively affect depth of focus (DOF), such that they cannot be focused as well with the lithography equipment as can dense features.

OPC can be used to correct the isolated-dense proximity effect and the isolated-feature DOF reduction by adding scattering bars (SB)'s) and anti-scattering bars (ASB)'s) near the edges of opaque and clear features, respectively, on a photomask. SB's are sub-resolution opaque-like features, whereas ASB's are sub-resolution clear-like features. SB's and ASB's are specific examples of assist features, which are features added to the mask that are not specifically part of the intended semiconductor design, but which assist the proper imprinting of the design on the photoresist. Both SB's and ASB's serve to alter the images of isolated and semi-isolated lines to match those of densely nested lines, and improve DOF so that isolated lines can be focused as well as dense lines can with the lithography equipment. For example, FIG. 1A shows a set of SB's 100, whereas FIG. 1B shows the placement of such sets of SB's 100 near an isolated line 102, in contradistinction to the dense sets of lines 104 and 106.

Another issue that impacts the quality of lithography is focus variation, which is nearly ubiquitous in IC manufacturing because of the combined effects of many problems, such as wafer non-flatness, auto-focus errors, leveling errors, lens heating, and so on. A useful lithographic process should be able to print acceptable patterns in the presence of focus variation. Similarly, a useful lithographic process should be able to print acceptable patterns in the presence of variation in the exposure dose, or energy, of the light source being used. To account for these simultaneous variations of exposure dose and focus, it is useful to map out the process window, such as an exposure-defocus (ED) window, within which acceptable lithographic quality occurs. The process window for a given feature, with or without OPC to compensate for distortions, shows the ranges of exposure dose and defocus that permit acceptable lithographic quality.

For example, FIG. 2 shows a graph 200 of a typical ED process window for a given semiconductor pattern feature. The y-axis 202 indicates exposure dose of the light source being used, whereas the x-axis 204 indicates defocus. The line 206 maps exposure dose versus defocus at one end of the tolerance range for the CD of the pattern feature, whereas the line 208 maps exposure dose versus defocus at the other end of the tolerance range for the CD of the feature. The area 210 enclosed by the lines 206 and 208 is the ED process window for the pattern feature, indicating the ranges of both defocus and exposure dose that permit acceptable lithographic quality of the feature. Any defocus-exposure dose pair that maps within the area 210 permits acceptable lithographic quality of the pattern feature. As indicated by the area 210, the process window is typically indicated as a rectangle, but this is not always the case, nor is it necessary.

Besides OPC, another approach that can be used to improve patterning is off-axis illumination (OAI). OAI is the shifting of the direction of the exposure beam during lithography from perpendicular, which interrupts the interference pattern that causes standing waves in the underlying photoresist being patterned. OAI particularly has the ability to significantly improve both the resolution and DOF for a given optical lithographic technology. For dense features, especially those having line-to-space duty ratios on the order of 1:1 to 1:2, such improvements are straightforward. Performance improvements are realized when illumination is obliquely incident on a mask at an angle so that the zeroth and first diffraction orders are distributed on alternative sides of the optical axis.

Examples of OAI are shown in FIGS. 3A and 3B. In FIG. 3A, the original center of illumination 302 has an illumination mask 304 positioned thereover. When an off-axis light source is instead used for illumination through the mask 304, first diffraction orders 306a and 306b result. The OAI of FIG. 3A is referred to as conventional OAI because the illumination mask 304 has a standard disc shape. In FIG. 3B, the original center 302 has an illumination mask 310 positioned thereover, resulting in diffraction orders 312a and 312b. The OAI of FIG. 3B is referred to as annular OAI because the illumination mask 310 has a ring shape. Other types of OAI include dipole, quadrupole, and quasar, which vary from one another and from conventional and annular OAI based on the illumination mask shapes used in such types of OAI.

Unfortunately, OAI does not improve resolution or DOF for isolated features. This is because discrete diffraction orders do not exist for isolated features; rather, a continuous diffraction pattern is produced. Therefore, OAI is used in conjunction with assist features, such as SB's and ASB's, so that both dense features and isolated features have larger process windows for photolithography. The addition of assist features to the mask effectively allows the isolated features to mimic the dense features during lithographic processes.

Most assist features for isolated features are intended for semiconductor features that are lines. Lines are essentially one-dimensional features for which assist features can be more easily formulated and added to the mask. Other types of features, however, are more two-dimensional in nature, such as contacts, which makes creation of assist features for such features more difficult. Contacts are typically, but not necessarily, to substantially square semiconductor features. They generally allow external electrical connectivity to semiconductor devices. Whereas OAI can improve resolution and DOF for dense arrays and groupings of contacts, it is not as successful for isolated, and semi-dense random contacts, which are generally referred to herein as non-dense contacts. Isolated contacts can more generally appear either randomly or on an orderly or regular basis within a design. Semi-dense contacts are those that appear with a periodicity less than a given threshold.

Because OAI does not improve resolution and DOF for such non-dense contacts, assist features are usually added to them. Different types of assist features have been proposed and used for such contacts, such as those shown in FIGS. 4A, 4B, and 4C. In FIG. 4A, an octagon-shaped assist feature 404 is used to improve photolithography of the contact 402. However, the assist feature 404 of FIG. 4A does not have a clear definition for semi-dense contacts. Furthermore, mask manufacturing of such a feature is difficult because of the very small forty-five degree angle patterns involved in the feature. In FIG. 4B, a square-shaped assist feature 406 is used to improved photolithography of the contact 402. Whereas the assist feature 406 of FIG. 4B is easier to print than the feature 404 of FIG. 4A is, it does not provide as good an improvement in the resulting photolithography. In FIG. 4C, the assist feature having lines 408a, 408b, 408c, and 408d is used to improve photolithography of the contact 402. However, the definition of the assist feature of FIG. 4C is not very clear for random contacts.

Therefore, there is a need for an assist feature for isolated, and semi-dense random contacts that overcomes the problems associated with the assist features for such non-dense contacts in the prior art. Such an assist feature should have clear definition for all of isolated, and semi-dense random contacts. Mask manufacture for such an assist feature should also not be overly difficult. For instance, the assist feature should be easily programmable with existing design-rule check (DRC) tools. For these and other reasons, there is a need for the present invention.

SUMMARY OF THE INVENTION

The invention relates to an assist feature for isolated, and semi-dense random contacts, as may be present on a photomask used in photolithographic processes for semiconductor device fabrication. The assist feature can be used in conjunction with off-axis illumination (OAI) for such non-dense contacts, for improving the depth of focus (DOF), resolution, or both of photolithography for such contacts, such that the non-dense contact at least more closely and preferably substantially mimics a dense contact during OAI. A photomask of the invention includes a number of assist features situated near and around the non-dense contact.

The size of the assist features is smaller than the size of the non-dense contact, such as between twenty and ninety percent of the size of the contact. There may be between six and twelve such assist features, and preferably there are eight. The assist features may be situated in a symmetrical and/or regular pattern around the non-dense contact, where each feature is equally distant from the contact. The features may further be substantially identical to one another, having a shape at least substantially similar to the shape of the non-dense contact.

The invention provides for advantages not found within the prior art. The assist features of the invention provide for clear definition of isolated, semi-dense, and other types of non-dense random contacts. The assist features increase depth of focus (DOF) and resolution for such contacts, and also reduce mask error enhancement factor (MEF). Photomask manufacture of such assist features is also relatively easy, because the assist features are easily programmable with existing design-rule check (DRC) tools.

Other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1A:
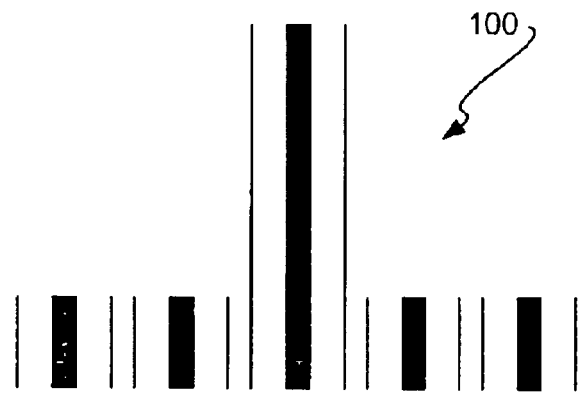
FIGS. 1A and 1B are diagrams showing a scattering bar (SB) and its placement near an isolated line, to compensate for isolated-dense proximity effect.
Figure 1B:
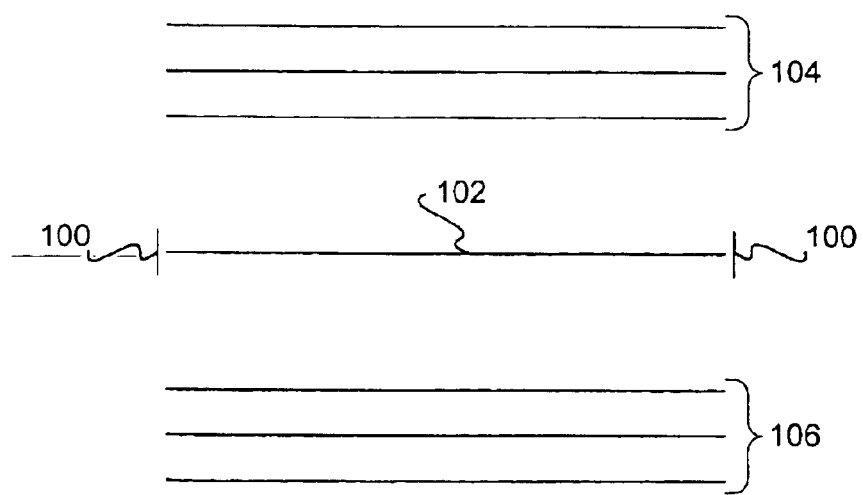
Figure 2:
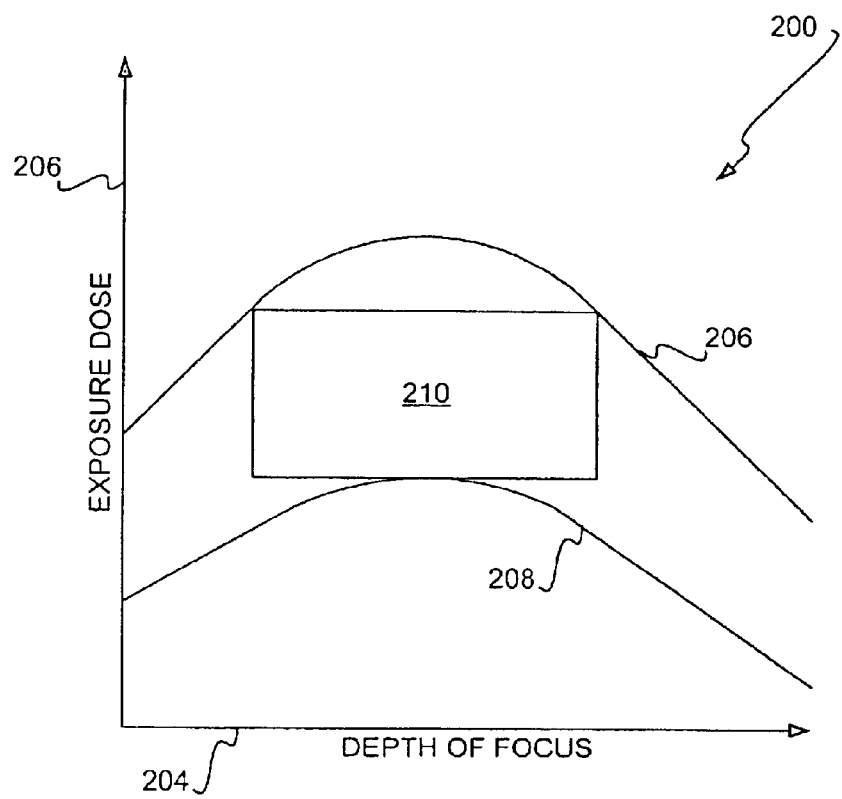
FIG. 2 is a diagram showing an example exposure-defocus (ED) process window for a given pattern feature showing the ranges of exposure dose and focus that permit acceptable lithographic quality.
Figure 3A:
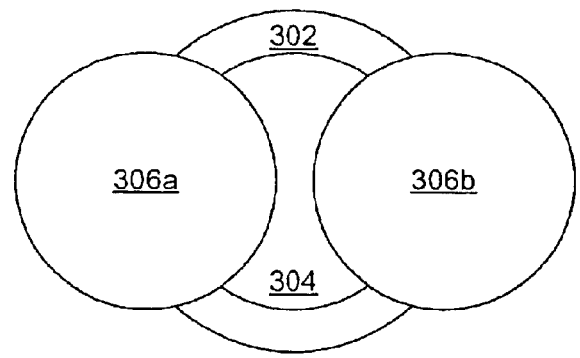
FIGS. 3A and 3B are diagrams showing the diffraction orders that result from different types of off-axis illumination (OAI).
Figure 3B:
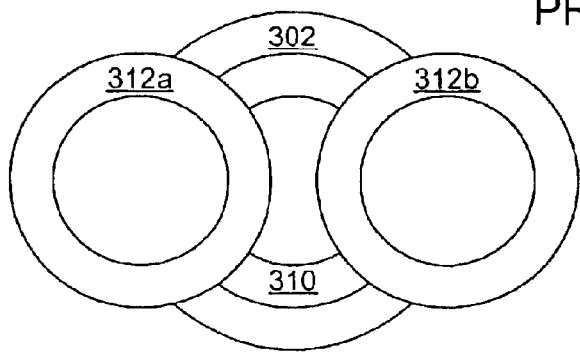
Figure 4A:
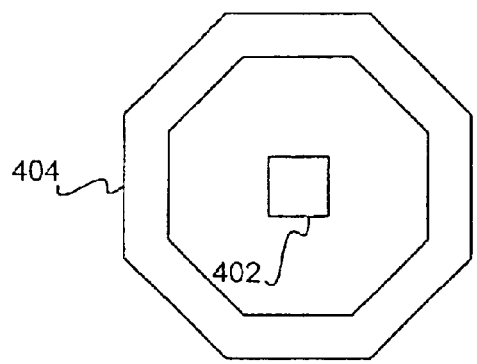
FIGS. 4A, 4B, and 4C are diagrams of conventional assist features for random, isolated, and semi-dense contacts.
Figure 4B:
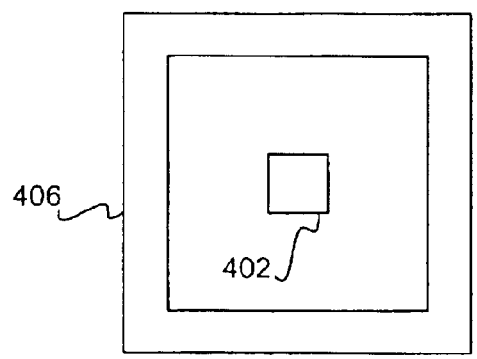
Figure 4C:
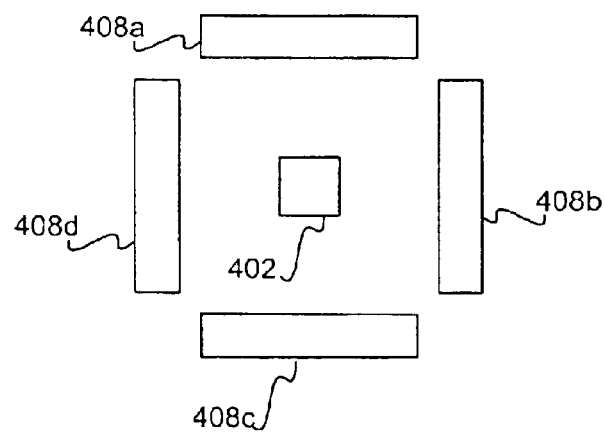
Figure 5A:
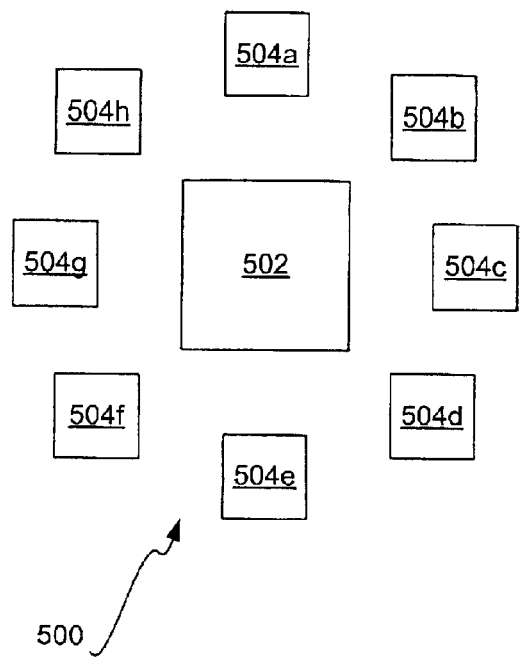
FIGS. 5A and 5B are diagrams of example assist features for non-dense contacts, according to embodiments of the invention.
Figure 5B:
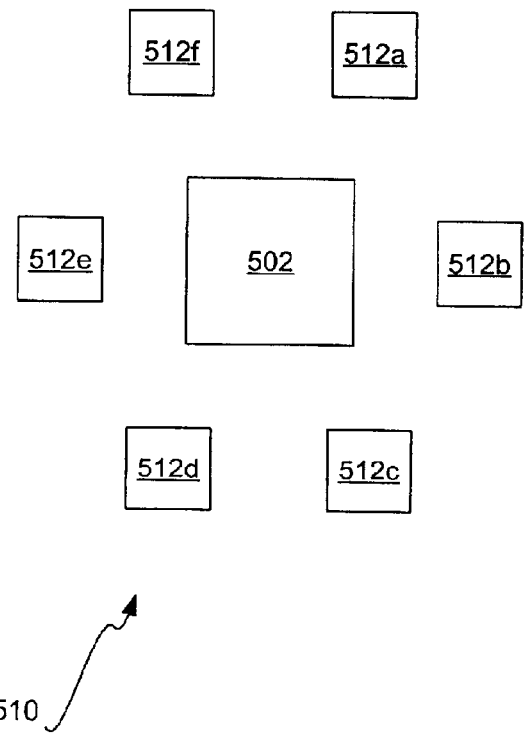

FIGS. 5A and 5B show example assist features according to the invention, as may be created on photomasks for photolithography employing off-axis illumination (OAI). In FIG. 5A, near and around the non-dense contact 502 are eight assist features 504a, 504b, 504c, 504d, 504e, 504f, 504g, and 504h. By comparison, in FIG. 5B, near and around the non-dense contact 502 are six assist features 512a, 512b, 512c, 512d, 512e, and 512f. The non-dense contact 502 may be an isolated contact, a random contact, a semi-dense contact, or another type of non-dense contact.

The assist features of FIGS. 5A and 5B are preferably arranged in a symmetrical and/or a regular pattern around the non-dense contact 502. For instance, the assist features of FIG. 5A are arranged octagonally near and around the contact 502, whereas the assist features of FIG. 5B are arrange hexagonally near and around the contact 502. Preferably, there are eight such assist features around the contact 502, but there may be at least six assist features, and as much as less than twelve assist features. The features are preferably equidistant from each nearby other, as well as from the non-dense contact 502.

The size of the assist features of FIGS. 5A and 5B is less than the size of the non-dense contact 502, such as between twenty and eighty percent of the size of the contact 502. As shown in FIGS. 5A and 5B, the assist features may be at least substantially identical to one another, with respect to their size and shape. The assist features preferably have a shape at least substantially similar to the shape of the non-dense contact 502. For instance, as shown in FIGS. 5A and 5B, the assist features as well as the contact 502 have a square or at least rectangular shape.

Figure 6:
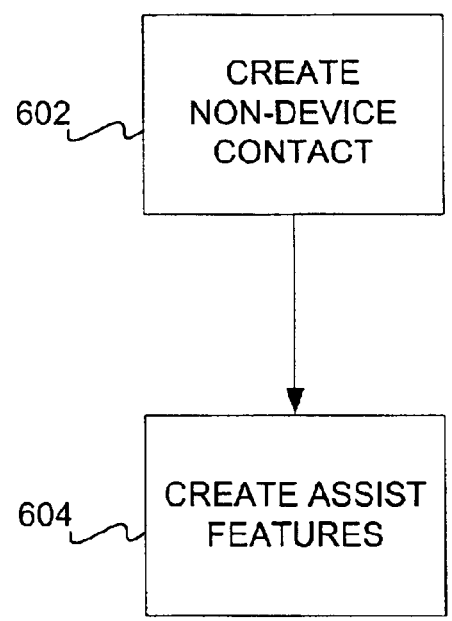
FIG. 6 is a flowchart of a method to create a photomask having assist features and one or more non-dense contacts, according to an embodiment of the invention.
Figure 6:
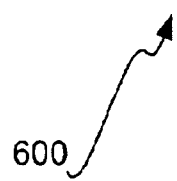

FIG. 6 shows a method 600 for producing a photomask including assist features in accordance with the invention. First, one or more non-dense contacts are created on the mask (602), such as isolated, and/or semi-dense random contacts. Next, assist features are created on the mask situated near and around each of the non-dense contacts (604).

Figure 7:
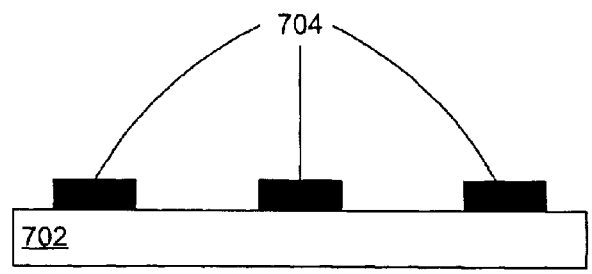
FIG. 7 is a diagram showing the side profile of an example photomask, such as that which can include assist features according to an embodiment of the invention.

A side profile of an example mask is shown in FIG. 7, and includes a glass surface 702 on which chrome 704 is added. The chrome 704 corresponds to the pattern, such as the non-dense contact and/or its associated assist feature (s), to be imprinted on the semiconductor wafer. Areas of the mask that do not have chrome added to the glass surface are referred to generally as clear regions, whereas areas that do have chrome added to the glass surface are referred to generally as opaque regions.

Figure 8:
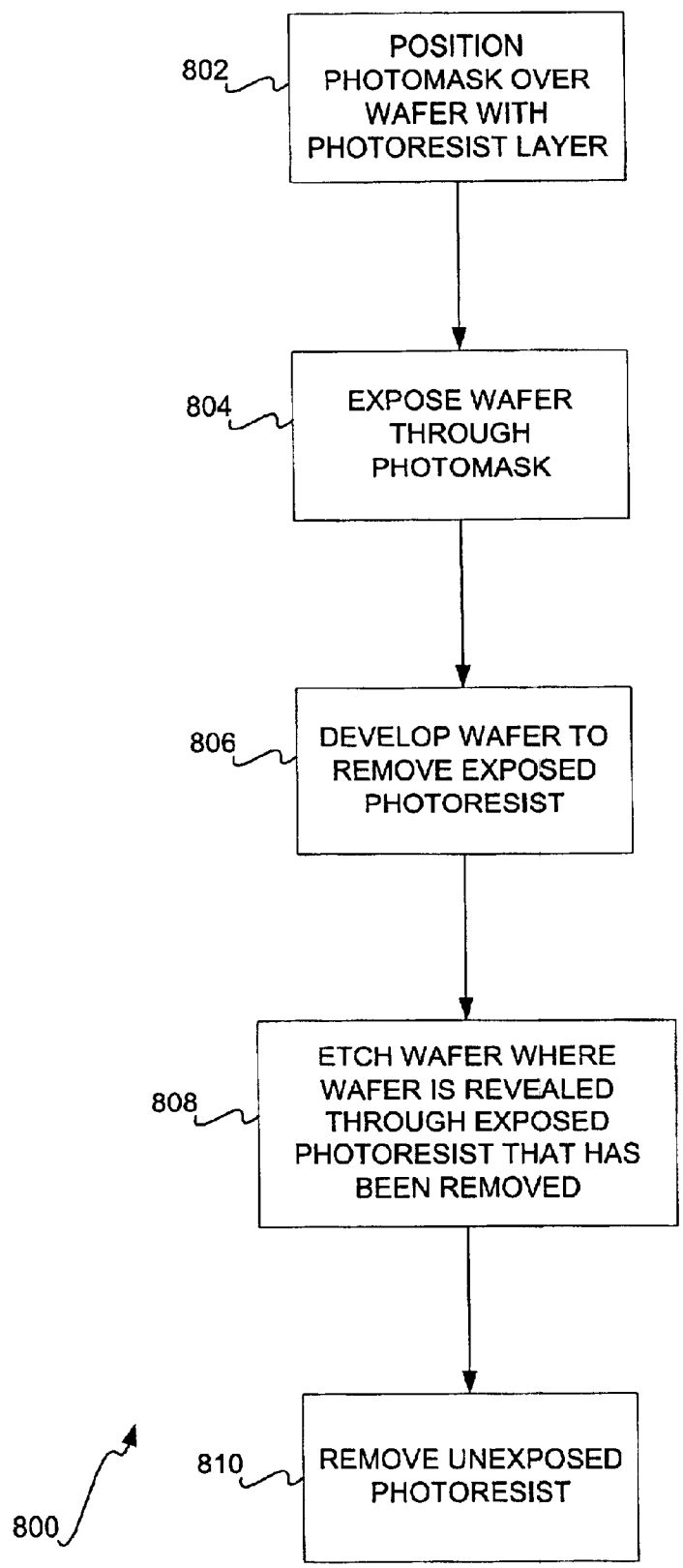
FIG. 8 is a flowchart of a typical method to create one or more semiconductor devices on a wafer using a photolithographic process, and preferably employing a photomask including assist features according to an embodiment of the invention.

FIG. 8 outlines a typical method 800 for fabricating semiconductor devices on a semiconductor wafer, and in conjunction with which a photomask having assist features according to the invention may be utilized. Other steps and acts may be performed in addition to or in lieu of those shown in FIG. 8, as can be appreciated by those of ordinary skill within the art. The mask is first positioned over the wafer, where the wafer has a top layer of photoresist (802). The wafer is exposed through the mask (804), such that the photoresist has unexposed and exposed regions. The exposed regions correspond to the photoresist that is beneath clear regions of the mask, and the unexposed regions correspond to the photoresist that is beneath opaque regions. The wafer is developed to remove the exposed photoresist (806), and then etched where the wafer has been revealed through the exposed photoresist that has been removed (808). The unexposed photoresist is then also removed (810).

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. An off-axis illumination (OAI) photomask for OAI semiconductor photolithography processing comprising:

a transparent substrate;

an opaque non-dense contact that is isolated and/or random; and, a plurality of opaque assist features situated near and around the non-dense contact, each assist feature having a size smaller than a size of the non-dense contact, the plurality of assist features improving at least one of depth of field (DOF) and resolution of the semiconductor photolithography processing.

2. The photomask of claim 1, wherein the plurality of assist features consists of at least six and less than twelve assist features.

3. The photomask of claim 1, wherein the plurality of assist features consists of eight assist features.

4. The photomask of claim 1, wherein the plurality of assist features are situated in a symmetrical pattern near and around the non-dense contact, each assist feature equally distant from the non-dense contact.

5. The photomask of claim 1, wherein the size of each assist feature is between twenty and eighty percent of the size of the non-dense contact.

6. The photomask of claim 1, wherein the plurality of assist features are at least substantially identical to one another.

7. The photomask of claim 1, wherein each assist feature has a shape at least substantially similar to a shape of the non-dense contact.

8. The photomask of claim 1, wherein the non-dense contact is an isolated contact.

9. The photomask of claim 1, wherein the non-dense contact is a random contact.

10. The photomask of claim 1, wherein the non-dense contact is both isolated and random.

11. A method for producing an off-axis illumination (OAI) photomask comprising:

creating a non-dense opaque contact on a transparent substrate of the photomask, the non-dense opaque contact being isolated and/or random; and, creating a plurality of substantially identical opaque assist features situated in at least a substantially regular pattern around the non-dense contact, each assist feature having a size smaller than a size of the non-dense contact, such that the plurality of assist features allow the non-dense contact to at least more closely mimic a dense contact during OAI.

12. The method of claim 11, wherein the plurality of assist features consists of at least six and less than twelve assist features.

13. The method of claim 11, wherein the size of each assist feature is between twenty and eighty percent of the size of the non-dense contact.

14. The method of claim 11, wherein each assist feature has a shape at least substantially similar to a shape of the non-dense contact.

15. The method of claim 11, wherein the non-dense contact is one or more of: an isolated contact, a random contact, and both isolated and random.

* * * * *